United States Patent [19]
Yoshikata et al.

[11] Patent Number: 5,365,174
[45] Date of Patent: Nov. 15, 1994

[54] MAGNETIC RESONANCE IMAGING APPARATUS

[75] Inventors: Mutsumi Yoshikata, Noda; Tsuneo Maeda, Tokyo, both of Japan

[73] Assignee: Hitachi Medical Corporation, Tokyo, Japan

[21] Appl. No.: 15,825

[22] Filed: Feb. 10, 1993

[30] Foreign Application Priority Data

Feb. 10, 1992 [JP] Japan .................................. 4-056487

[51] Int. Cl.⁵ .............................................. G01V 3/00
[52] U.S. Cl. .................................... 324/318; 324/322
[58] Field of Search ............... 324/318, 322, 307, 309, 324/314; 128/653.5

[56] References Cited

U.S. PATENT DOCUMENTS 4,788,502 11/1988 Keller et al. .................... 324/318
5,029,287 7/1991 Dessalles-Martin et al. ....... 324/318

Primary Examiner—Louis Arana
Attorney, Agent, or Firm—Antonelli, Terry, Stout & Kraus

[57] ABSTRACT

In a magnetic resonance imaging apparatus, picture quality of a tomographic image is prevented from deteriorating by reducing the influence due to a change in environmental magnetic field around magnetic field generating means. A phase correcting circuit for correcting the phase of a correcting current supplied to correcting magnetic field coils is provided in a correction control circuit which amplifies a detection signal representative of the change in the environmental magnetic field from a magnetic field sensor. This enables to correct the phase of a correcting magnetic field generated from the correcting magnetic field coils. The difference between the phase of the change in the environmental magnetic field and the correcting magnetic field generated by the correcting magnetic field coils can be reduced.

22 Claims, 6 Drawing Sheets

CORRECTING CURRENT I

PRIOR ART CORRECTING MAGNETIC FIELD F'

MAGNETIC RESONANCE IMAGING APPARATUS

BACKGROUND OF THE INVENTION

1. Field of the Invention

The present invention relates to a magnetic resonance imaging apparatus (hereinafter referred to as MRI apparatus) for providing a tomographic image of an object to be examined at an examination position using nuclear magnetic resonance (NMR) phenomenon and in particular to an MRI apparatus in which deterioration in picture quality of a tomographic image can be prevented by reducing the influence due to a change in environmental magnetic field around magnetic field generating means.

2. Description of the Related Art

Conventional MRI apparatus has been magnetically shielded by enclosing the peripheral six sides of the whole of the apparatus with a high permeable material such as permalloy, amorphous metals for preventing the picture quality of a tomographic image from deteriorating by reducing the influences due to a change in environmental magnetic field around magnetic field generating means. However, in this case, cost of materials and setting work is expensive and prevention of deterioration in picture quality is not complete.

In order to overcome this, an MRI apparatus as described in JP-A-Hei 2-45035 has been proposed. As shown in FIG. 1, a change F in the environmental magnetic field around magnetic field generating means (not shown) is detected by a magnetic field sensor 31 and a signal detected by the magnetic field sensor 31 is amplified by an amplifier 32. A correcting current is generated by a correcting magnetic field coil power source 33 depending upon the detected signal and is conducted through looped correcting magnetic field coils 34 which face to each other at upper and lower positions in a magnetic circuit for generating a static magnetic field and are disposed in a parallel relationship with each other so that a correcting magnetic field F' is generated in a direction opposite to the change F in the environmental magnetic field. This correcting magnetic field F' will cancel the change F in the environmental magnetic field.

In such a conventional MRI apparatus, the correcting magnetic field coils 34 are wound on the outer periphery of disc-shaped magnetic cores for enhancing the uniformity of the static magnetic field in the magnetic circuit for generating the static magnetic field. Accordingly, when the correcting current I is conducted through the correcting magnetic field coils 34 as shown in FIG. 2A, eddy currents are generated in the magnetic cores and peripheral magnetic members. The induced correcting magnetic field F' is delayed in phase with respect to the correcting current I as shown in FIG. 2B. Therefore, the change F in the environmental magnetic field can not be completely suppressed even if the change F in the environmental magnetic field is corrected with the delayed correcting magnetic field F'. As a result of this, a magnetic field which is shifted in place due to the delay remains as a residual magnetic field.

In contrast to this, in order to minimize the foregoing delay, an MRI apparatus in which the correcting magnetic field coils 34 are provided externally of a magnetic circuit for generating the static magnetic field and a differentiating circuit for correction the delay of the correcting current supplied to the correcting magnetic field coils is provided in a correcting control circuit comprising the amplifier 32 and the correcting magnetic field coil power source 33 has been proposed as described in JP-A-Hei 3-280936. In this case, when a factor which causes the change F in the environmental magnetic field is, for example, a vehicle such as an electric train, an automobile or an elevator disposed externally of the apparatus causing a relatively slow change (direct current change), the delay of the correcting magnetic field F' is hardly influenced by provision of the correcting means. A sufficient effect is obtained.

SUMMARY OF THE INVENTION

The present inventors have studied a further improvement in the MRI apparatus and have found the following technological solution.

If a factor causing the change F in the environmental magnetic field is a transformer disposed in the vicinity of the magnetic field causing an alternating change of a given frequency, the situation would be different. If the change F in the environmental magnetic field having a frequency of 50 Hz takes place as represented by a solid line in FIG. 3A, one period of the change would be 20 ms. At this time, it is assumed that a correcting magnetic field F' is applied and the delay of the correcting magnetic field F' is only 2 ms. In this case, since the correcting magnetic field F' is delayed by 36° with respect to the change F in the environmental magnetic field, the residual magnetic field which remains due to insufficient correction of the phase difference is about 60%. As a result of this, the change in the magnetic field occurring around the magnetic field generating means can not be sufficiently reduced. Blurring and ghosts are caused in the resultant image, which may cause the deterioration in picture quality in the obtained tomographic image.

The present invention therefore aims at overcoming at least one of the foregoing problems.

It is an object of the present invention to provide an MRI apparatus which is capable of preventing the picture quality of a tomographic image from deteriorating by reducing the influence from the change in environmental magnetic field around magnetic field generating means.

In order to accomplish the above mentioned object, the apparatus of the present invention comprises a circuit for advancing the phase of the correcting magnetic field F'. This circuit is preferably incorporated in a correction control circuit.

Since the delay of the correcting magnetic field F' changes depending upon the environment in which the MRI apparatus is disposed, the correction amount of the phase which is obtained by the phase advancing circuit (hereinafter referred to as "phase correcting circuit") is preferably variable. In embodiments, the correction amount of the phase can be desiredly preset by selecting capacitors and by using a variable resistor.

The change F in the environmental magnetic field with respect to the MRI apparatus can be detected by a universal type magnetic field measuring instrument. However, present inventor's study showed that the delay of the phase of the corrected magnetic field F' can not be determined by only the detected change F in the environmental magnetic field since the phase delay of the correcting magnetic field F' is influenced by the MRI apparatus per se.

Therefore, the present inventors newly produced an apparatus for detecting the phase delay of the correcting magnetic field F'. The detecting apparatus comprises a pair of coils and means for comparing currents induced by respective coils with each other. One of the coils is disposed within the MRI apparatus and the other coil is disposed externally of the MRI apparatus at a position where it is not influenced by the MRI apparatus. The change F in the environmental magnetic field is detected. The external coil generates an induction current depending upon the change F. The internal coil generates an induction current which is delayed in phase by a given period of time with respect to that of the external coil since the internal coil is influenced by eddy currents generated by the MRI apparatus. The phase delay is detected by comparing means.

After the MRI apparatus has been set up in an examination room of a hospital, the delay in phase is determined by the detecting apparatus. The correction amount of the phase by the phase correcting circuit is adjusted for canceling the delay in phase.

If the phase of the correcting current supplied to the correcting magnetic field coils can be corrected by the phase correcting circuit, the correcting magnetic field generated from the correcting magnetic field coils can be corrected. Accordingly, the phase difference between the change in the peripheral environmental magnetic field and the correcting magnetic field generated by the correcting magnetic field coil is suppressed. Therefore, picture quality of the tomographic image can be prevented from deteriorating by reducing or eliminating the influence from the change in the peripheral environmental magnetic field.

BRIEF DESCRIPTION OF THE DRAWINGS

These and other objects and technical advantages of the present invention will be readily apparent from the following description of the preferred exemplary embodiments of the invention in conjunction with the accompanying drawings, in which.

DESCRIPTION OF THE PREFERRED EMBODIMENTS

Embodiments of the present invention will be described with reference to annexed drawings.

Figure 4:
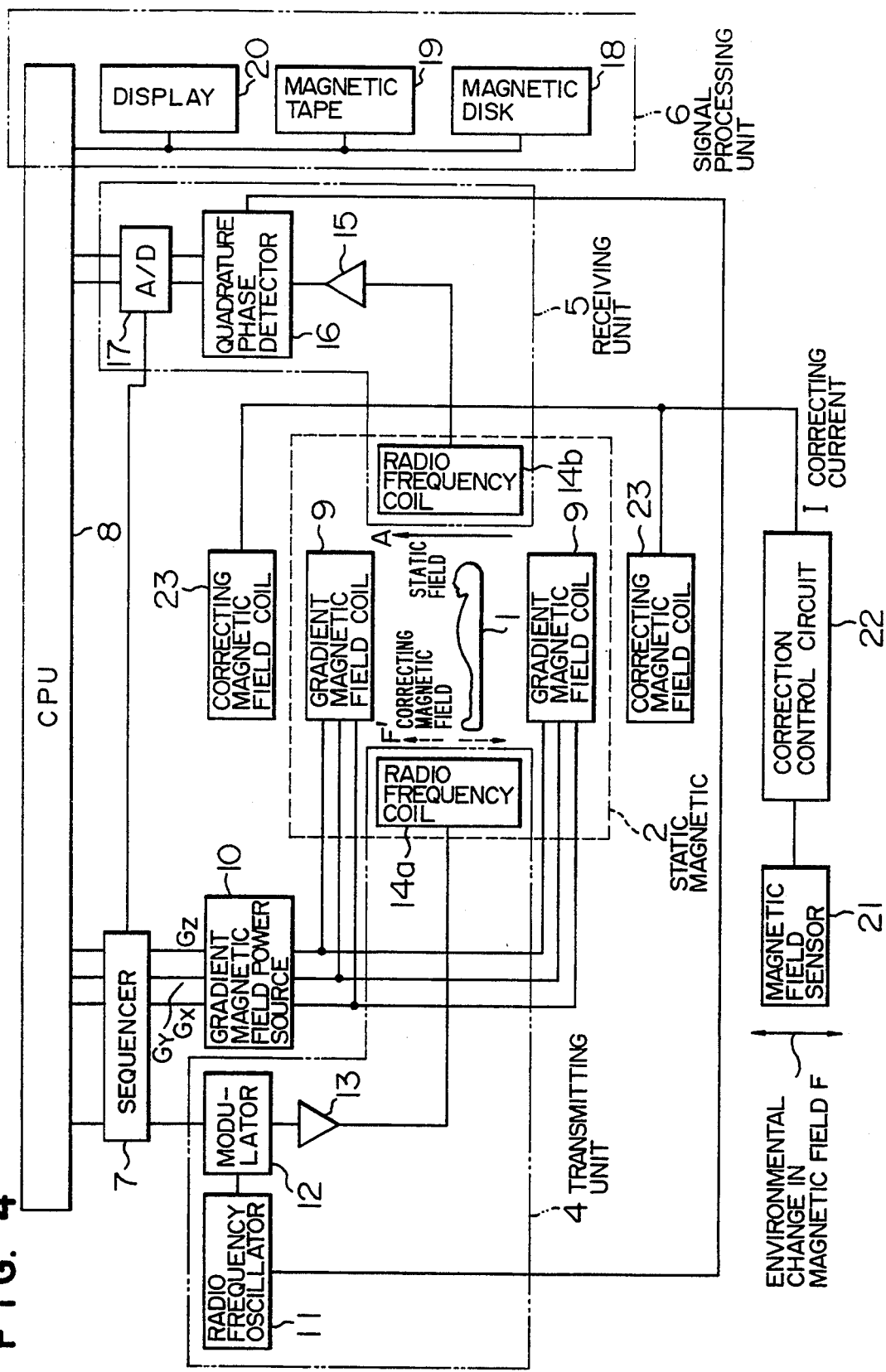
FIG. 4 is a block diagram showing an embodiment of an MRI apparatus of the present invention.

Referring now to FIG. 4, there is shown the block diagram showing the whole structure of an embodiment of an MRI apparatus of the present invention. The MRI apparatus provides tomographic images of an object to be examined by using the nuclear magnetic resonance (NMR) phenomenon and comprises a static magnetic field generating magnet 2, a gradient magnetic field generator system 9, 10, a transmitting unit 4, a receiving unit 5, a signal processing unit 6, a sequencer 7, a central processing unit (CPU) 8, a magnetic sensor 21, a correcting control circuit 22 and correcting magnetic coils 23 as shown in the drawing.

The static magnetic field generating magnet 2 generates a uniform static magnetic field in an axial direction of the object to be examined (horizontal direction) and in a direction perpendicular to the axial direction of the object (vertical direction) around the object 1 to be examined. Magnetic field generator which is of permanent magnet type or normal conducting or super conducting type is disposed in a space extending around the object to be examined. The gradient magnetic field generator comprises gradient magnetic field coils 9 which are wound in three axial directions such as X, Y and Z directions and a gradient magnetic field power source 10 for driving respective coils. Gradient magnetic fields Gx, Gy and Gz in respective three axial directions such as X, Y and Z directions are applied to the object 1 to be examined by driving the gradient magnetic field power source 10 for driving respective coils 9 in accordance with instructions from the sequencer 7. Slice planes with respect to the object 1 to be examined can be preset by way of applying the gradient magnetic fields.

The transmitting unit 4 transmits electromagnetic waves toward the object 1 to be examined for inducing nuclear magnetic resonance in nuclei of atoms which constitute the living body tissue of the object 1 to be examined and comprises a radio frequency oscillator 11, a modulator 12, a radio frequency amplifier 13, a radio frequency transmitting coil 14a. The radio frequency pulses which are output from the radio frequently oscillator 11 are amplitude-modulated by a modulator 12 in accordance with instructions from the sequencer 7. The amplitude-modulated radio frequency pulses are amplified by the radio frequency amplifier 13 and thereafter are supplied to the radio frequency coil 14a which is adjacent to the object 1 to be examined for transmitting the electromagnetic waves toward the object 1 to be examined.

The receiving unit 5 detects the electromagnetic waves (NMR signals) emitted from the nuclei of the living body tissue of the object 1 to be examined due to nuclear magnetic resonance of the nuclei and comprises a radio wave receiving coil 14b, an amplifier 15, a quadrature phase detector 16 and an A/D converter 17. The electromagnetic waves (NMR signals) which are generated by the object to be examined in response to the electromagnetic waves emitted from the radio frequency transmitting coil 14a are detected by the radio wave receiving coil 14b which is disposed in the vicinity of the object 1 to be examined and then input to the A/D converter 17 via the amplifier 15 and the quadrature phase detector 16 so that they are converted into digital values, which are then divided into two series collected data which are sampled by the quadrature phase detector 16 in a timing relationship instructed by the sequencer 7. The signals representing the collected data are sent to the signal processing unit 6.

The signal processing unit 6 comprises the CPU 8, recording devices such as magnetic disk 18 and a magnetic tape 19, and a display 20 such as CRT. Fourier transformation, calculation of correction coefficients and processing for image reconstruction is performed in the CPU 8. The distribution of signal strength on a desired section or the distribution which is obtained by performing appropriate operations on a plurality of signals is visualized and is displayed on the display 20 as a tomographic image.

The sequencer 7 is operated under control of the CPU 8 for sending various instructions which are necessary for acquisition of data of the tomographic images of the object 1 to be examined to the transmitting unit 4, the magnetic field gradient generating system 9, 10 and the receiving unit 5 for controlling the sequence for measuring the NMR signals. As shown in FIG. 4, the radio frequency transmitting coil 14a, the radio frequency receiving coil 14b and the gradient magnetic field coils 9 are disposed in the magnetic field which is established by the static magnetic field generating magnet 2 disposed in the space around the object 1 to be examined.

Figure 5:
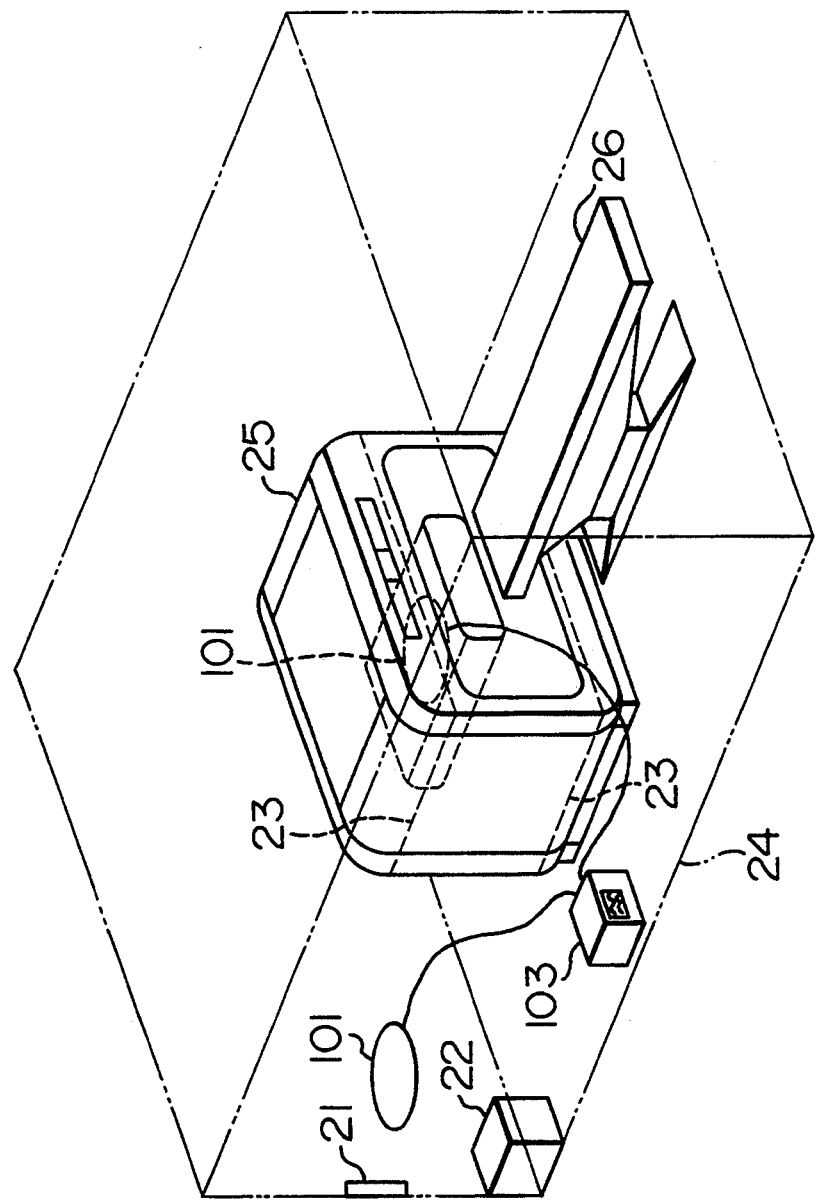
FIG. 5 is a perspective explanatory view showing correcting magnetic field coils which are disposed for the MRI apparatus installed in an examination room.

MRI apparatuses having such a structure are commercially available as trade name MRP-7000 from Hitachi Medical Corporation. A magnetic field sensor 21 detects a change F in environmental magnetic field in a direction of the static magnetic field represented by an arrow A around the static magnetic field generating magnet 2 and is disposed within an examination room 24 in which the MRI apparatus is disposed, for example at the corner of the examination room where the change in environmental magnetic field readily occur as shown in FIG. 5. The correcting control circuit 22 generates a correction current I for reducing the influences due the changes in environmental magnetic field F by amplifying the input detected signal from the magnetic field sensor 21 and is provided, for example, in the examination room 24 at the corner thereof as shown in FIG. 5. The correcting current I output from the correction control circuit 22 for generating a correction magnetic field F' in a direction opposite to that of the change F in the environmental magnetic field. A pair of correcting magnetic field coils 23 are disposed externally of the static magnetic field generating magnet 2 so that they faces to each other as shown in FIGS. 4 and 5.

A reference numeral 25 in FIG. 5 denotes a gantry which houses therein the static magnetic field generating magnet 2, the gradient magnetic field coils 9, the radio frequency transmitting and receiving coils 14a and 14b which are shown in FIG. 4. A reference numeral 26 denotes a table which slides forward and backward along the object 1 to be examined.

In the present invention, a phase correcting circuit 28 is provided in the correction control circuit 22. The phase correcting circuit 28 corrects the phase of the correcting circuit I which is supplied to the correcting magnetic field coil 23 and is provided at the subsequent stage of an amplifier 27 for amplifying the signals detected by the magnetic field sensor 21 and at the previous stage of the correcting magnetic field coil power source for supplying the correcting current I. The phase correcting circuit 28 comprises input resistors R and a capacitor C, an operational amplifier 20 and an external feedback resistor R. The phase shift amount is represented as follows:

$$2 \tan^{-1} \omega RC \qquad (1)$$

wherein $\omega$ represents an alternating electrical angular velocity having a frequency f.

Although the electrical angular velocity $\omega$ is determined by the frequency f at this time, the phase shift amount represented by the expression (1) can be desiredly changed by using a variable resistor and a variable capacitor.

The sensor 21, the correction control circuit 22 (excepting the phase correcting circuit 28) and the coils 23 are identical with those of a correcting magnetic field generator which is commercially available as trade name MR-FC from Hitachi Medical Corporation.

Figure 3A:
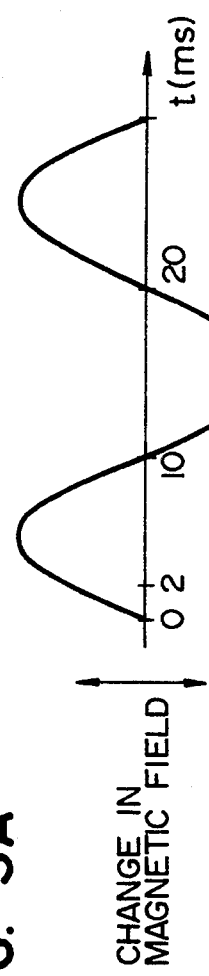
FIGS. 3A, 3B and 3C are wave form views showing the relation between the magnetic fields in the prior art and the present invention.
Figure 3B:
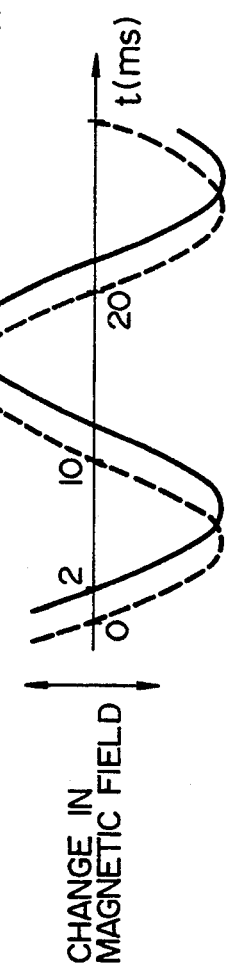
Figure 3C:
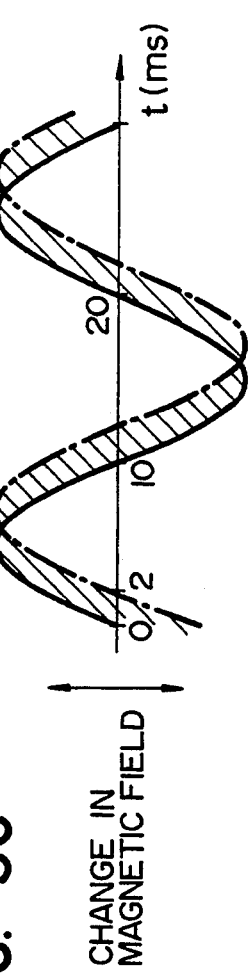
Figure 6:
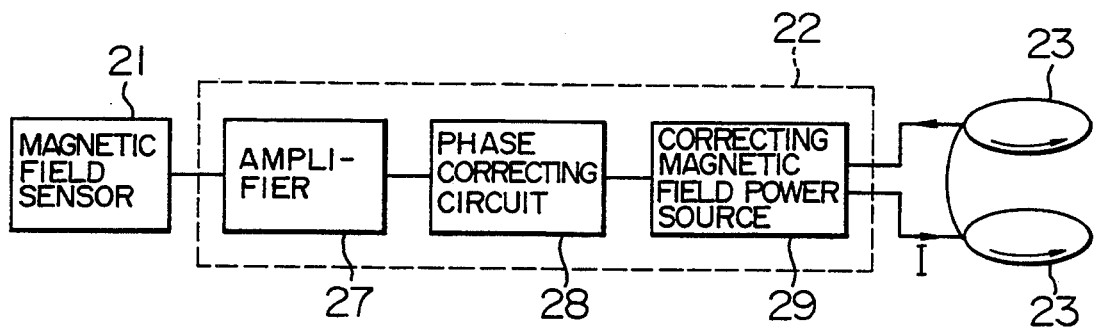
FIG. 6 is a block diagram showing a correction control circuit.

Now, operation of the correction control circuit 22 which is constructed as shown in FIG. 6 will be described. Firstly, a detection signal representative of the change F in the environmental magnetic field which is detected by the magnetic field sensor 21 is input to and amplified by the amplifier 27 in the correction control circuit 22. The signal which has been amplified by the amplifier 27 is then input to the phase correcting circuit 28 to preliminarily advance the phase by the amount represented by the expression (1). In case where the correcting magnetic field which is represented by a solid line in FIG. 3B is delayed in phase by 36° for 2 ms as described with reference to FIG. 3, it suffices to advance the phase by 36° by means of the phase correcting circuit 28. The phase correcting circuit 28 then generates a signal of the correcting current which is advanced by 36° in phase and sends it to next correcting magnetic field coil power source 29. This causes the correcting magnetic field coil power source 29 to generate the correcting current I which is advanced by 36° in phase and to supply it to the correction magnetic field coils 23. As a result of this, a correcting magnetic field F' which is advanced by 36° in phase with respect to the conventional correcting magnetic field F' represented by a solid line is generated as represented by a dotted line in FIG. 3. This will reduce or eliminate the phase difference between the change F in the peripheral environmental magnetic field represented in FIG. 3A and the correcting magnetic field F' in the present invention represented by the dotted line in FIG. 3B. Accordingly, conventional residual magnetic field represented by hitching lines in FIG. 3C can be reduced or eliminated.

The delay time of the correcting magnetic field F' represented by the solid line in FIG. 3B caused due eddy current is assumed to be 2 ms in the foregoing description. However, the delay time of the correcting magnetic field F' will change depending upon the positional relation between sources of the change F in environmental magnetic field such as transformer, the gantry 25, other peripheral magnetic members and the magnetic field sensor 21 and the weight of the magnetic members including the gantry 25. Also, the phase of the correcting magnetic field F' will change depending upon the frequency of the change F in the peripheral environmental magnetic field.

Figure 8:
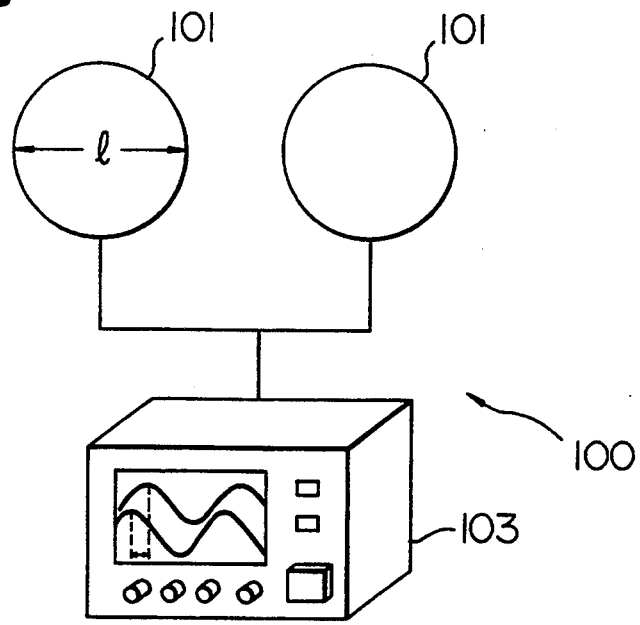
FIG. 8 is a schematic view showing an apparatus for measuring the phase delay of the correcting field.

Hence, the phase delay amount of the correcting magnetic field F' is measured by means of a device 100 for measuring the phase delay amount shown in FIG. 8. The measuring device 100 comprises a pair of coils 101 and an oscilloscope 103. Respective coils 101 are constructed in such a manner that they generates the substantially same induction currents. Each coil 101 in the embodiment is in the form of a cylinder having a diameter 1 of 500 mm is wound and in turns 400 turns of a copper wire of 1 mm. The coil having such a structure provides an output of 2 mm V for the change in magnetic field of 1 mG. The oscilloscope is of a universal type.

One of the coils 101 of the measuring device 100 having such a structure is disposed within the gantry 25 in which a patient to be examined lies and the other coil 101 is disposed in the vicinity of the magnetic field sensor 21 where there is no influence of the MRI apparatus. The induction currents induced by the coils 101 are observed. The current generated by the coil 101 in the gantry 25 is delayed in phase by a given period of time with respect to the current generated by the external coil 101. This delay is measured by the oscilloscope 103.

Figure 1:
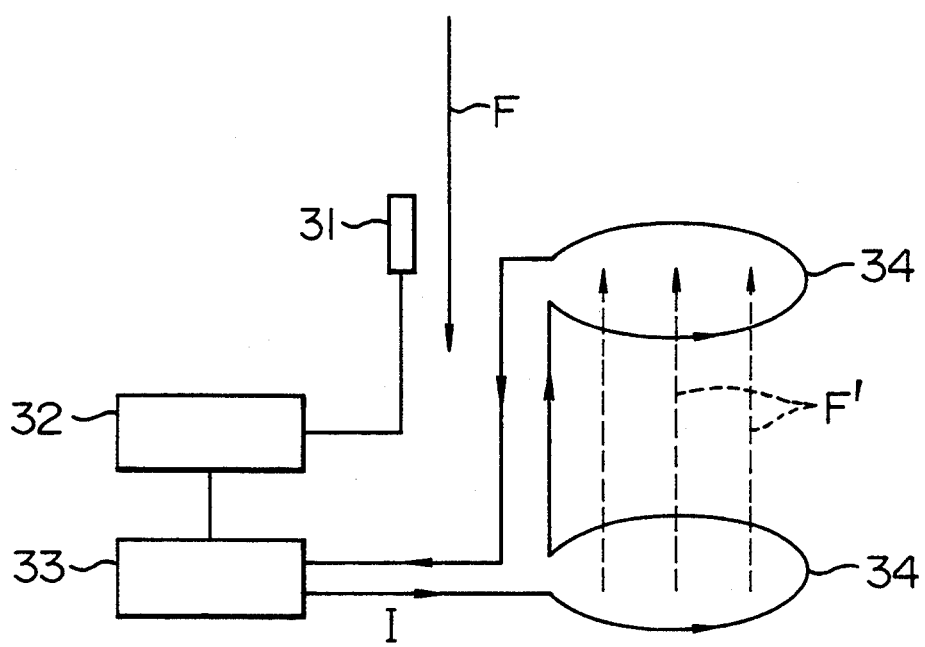
FIG. 1 is an explanatory view illustrating the principle of generation of a correcting magnetic field for a change in the environmental magnetic field by a magnetic field sensor and a correcting magnetic field coil.
Figure 2A:
FIGS. 2A and 2B are timing charts for illustrating the timing of generation of the correcting magnetic field with respect to a correcting current in a prior art.
Figure 2B:
Figure 7:
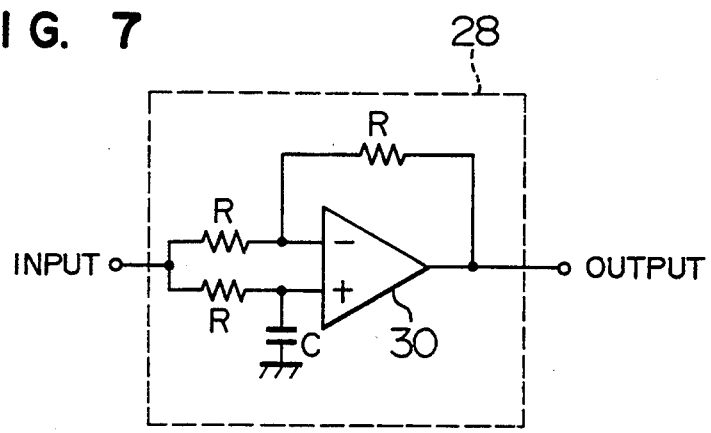
FIG. 7 is a circuit diagram showing a phase correcting circuit.
Figure 9:
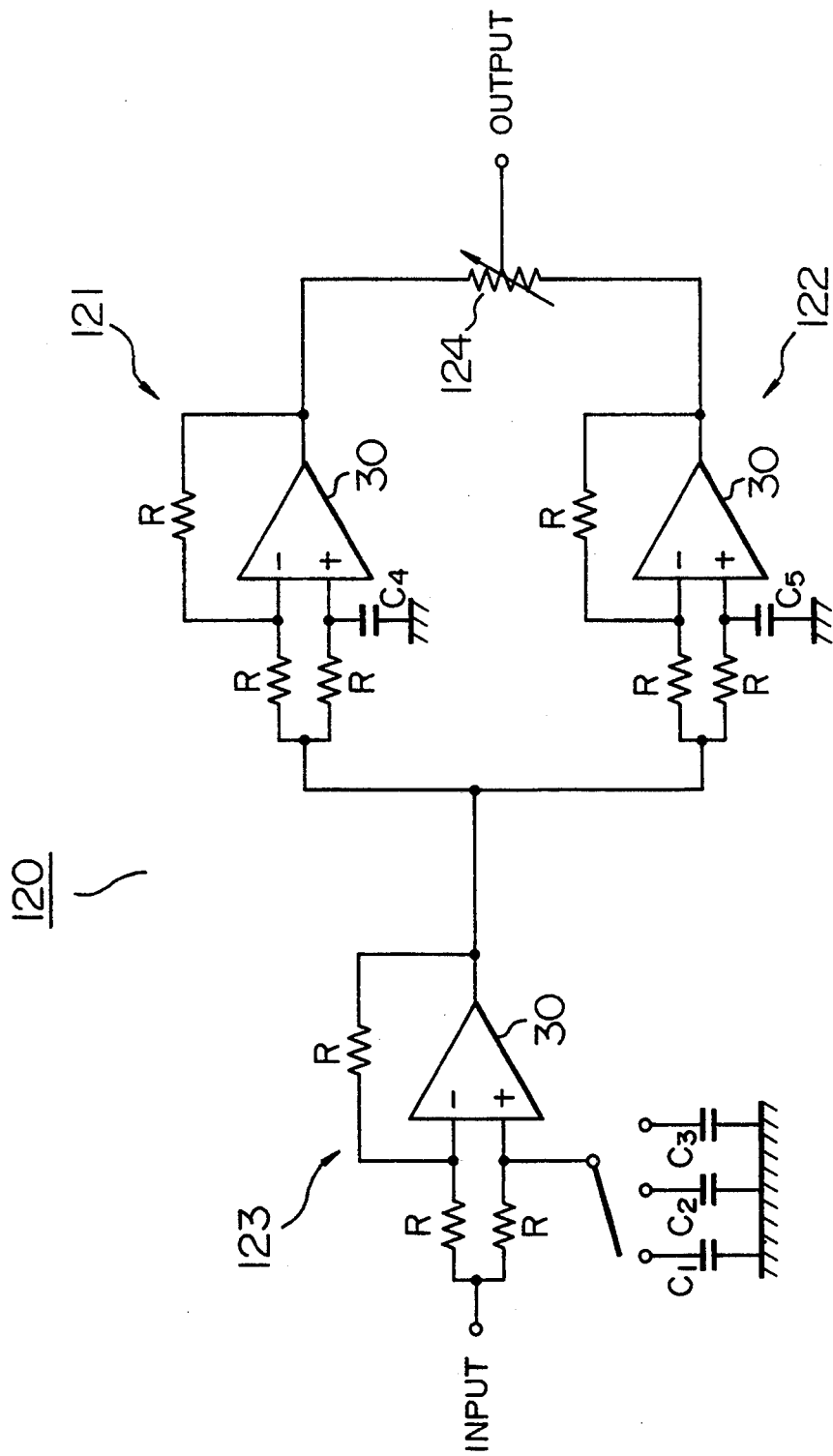
FIG. 9 is a circuit diagram showing a phase correcting circuit in another embodiment.

A phase correcting circuit 120 for adjusting the phase correction of the correcting magnetic field F' is shown in FIG. 9. The circuit 120 comprises a pair of in parallel connected circuits 121 and 122 each of which is substantially identical with the circuit 28 shown in FIG. 7 except for the capacitor C4 or C5 and a circuit 123 which is in series connected with the pair of the circuits 121 and 122. The circuit 123 also differs from the circuit 28 of FIG. 2 only in the capacitor. A reference numeral 124 in the drawing denotes a variable resistor. The resistance of each resistor R is 10 kΩ. Capacitors C1 and C5 are 0.69 μF which advance the phase by 135°. Capacitor C2 is 0.33 μF which advances the phase by 90°. Capacitors C3 and C4 are 0.13 μF which advance the phase by 45°. This enables to correct the phase within the range of 0° to 180°. Correction of the phase in the range of 180° to 360° is made possible by reversing the polarity.

Capacitors in the circuit 123 are properly selected and the variable resistor 124 are adjusted in such a manner that the same phase delay as that measured by the measuring device 100 in FIG. 8 is obtained.

Since the present invention is constructed as mentioned above, the phase of the correcting current supplied to the correcting magnetic field coil can be corrected by the phase correcting circuit provided in the correction control circuit. This enables to correct the correcting magnetic field generated from the correcting magnetic field coils so that the phase difference between the change in the peripheral environmental magnetic field and the correcting magnetic field generated by the correcting magnetic field coil. Therefore, picture quality of the tomographic image can be prevented from deteriorating by reducing or eliminating the influence from the change in the peripheral environmental magnetic field.

The present invention has been described in detail, it should be understood that various changes, substitutions and alternations can be made hereto without departing from the spirit and scope of the present invention as defined by the appended claims.

What is claimed is:

1. A magnetic resonance imaging apparatus, comprising:

magnetic field generating means for applying a static magnetic field and gradient magnetic fields to an object to be examined;
    means for irradiating nuclei of atoms constituting the living body tissue of an object to be examined with electromagnetic waves for causing nuclear magnetic resonance;
    means for detecting electromagnetic waves emitted from the object owing to the nuclear magnetic resonance;
    means for performing an operation for reconstruction of an image by processing signals of electromagnetic waves detected by the detecting means;
    a magnetic field sensor for detecting a change in environmental magnetic field around said magnetic field generating means;
    correction control circuit for amplifying a detection signal from said magnetic field sensor for generating a correcting current;
    correcting magnetic field coil means to which the correcting current from the correction control circuit is input for generating a correcting magnetic field in a direction opposite to the change in the environmental magnetic field; and
    a phase correcting circuit for correcting the phase of the correcting current supplied to said correcting magnetic field coil means;
    wherein the correcting magnetic field coil means and the magnetic field sensor are disposed so as to be magnetically uncoupled.

2. A magnetic resonance imaging apparatus as defined in claim 1 in which said phase correcting circuit is capable of changing the correction amount of the phase.

3. A magnetic resonance imaging apparatus as defined in claim 2 and further including means for desiredly presetting the correction amount of the phase which is obtained by said phase correcting circuit.

4. A magnetic resonance imaging apparatus as defined in claim 2 in which said phase correcting circuit comprises an operational amplifier, resistors and a capacitor.

5. A magnetic resonance imaging apparatus as defined in claim 1 in which the magnetic field sensor is disposed externally of the magnetic field generating means so that the magnetic field sensor is unaffected by magnetic interference from the magnetic field generating means.

6. A magnetic resonance imaging apparatus as defined in claim 1 in which the magnetic field sensor detects an alternating change of frequency in the environmental magnetic field greater than 5 Hz.

7. A magnetic resonance imaging apparatus as defined in claim 6 in which the alternating change has a frequency of about 50 Hz.

8. A magnetic resonance imaging apparatus as defined in claim 1 in which the magnetic field sensor is disposed externally of the magnetic field generating means.

9. An apparatus for measuring the difference between the phases of magnetic fields which are internal and external of a magnetic resonance imaging apparatus, comprising:

a pair of coils having the same performance for an induction current, one and the other of the coils being disposed internally and externally of said magnetic resonance imaging apparatus respectively; and
    means for comparing the phases of the currents induced by respective coils with each other.

10. A magnetic resonance imaging method, comprising the steps of:

applying a static magnetic field and gradient magnetic fields to an object to be examined by a magnetic field generating means;
    irradiating nuclei of atoms constituting the living body tissue of an object to be examined with electromagnetic waves for causing nuclear magnetic resonance;

detecting electromagnetic waves emitted from the object owing to the nuclear magnetic resonance;

performing an operation for reconstruction of an image by processing signals of electromagnetic waves detected by the detecting means;

detecting a change in environmental magnetic field around said magnetic field generating means by a magnetic field sensor;

amplifying a detection signal from said magnetic field sensor for generating a correcting current by a correction current circuit;

receiving the correcting current from the correction control circuit for generating a correcting magnetic field in a direction opposite to the change in the environmental magnetic field; and correcting the phase of the correcting current supplied to correcting magnetic field coil means;

wherein the correcting magnetic field coil means and the magnetic field sensor are disposed so as to be magnetically uncoupled.

11. A magnetic resonance imaging method as defined in claim 10 in which the magnetic field sensor is disposed externally of the magnetic field generating means so that the magnetic field sensor is unaffected by magnetic interference from the magnetic field generating means.

12. A magnetic resonance imaging method as defined in claim 10 in which the magnetic field sensor detects an alternating change of frequency in the environmental magnetic field greater than 5 Hz.

13. A magnetic resonance imaging method as defined in claim 12 in which the alternating change has a frequency of about 50 Hz.

14. A magnetic resonance imaging apparatus as defined in claim 10, in which the magnetic field sensor is disposed externally of the magnetic field generating means.

15. An apparatus for applying a correcting magnetic field to the inside of a nuclear resonance imaging apparatus, comprising:

a magnetic field sensor for detecting the change in magnetic field around a magnetic field generating means of said nuclear resonance imaging apparatus;

a correction control circuit for amplifying a detection signal from said magnetic field sensor for generating a correcting current;

a correcting magnetic field coil to which the correcting current from the correction control circuit is input for generating a correcting magnetic field in a direction opposite to the change in the environmental magnetic field; and a phase correcting circuit for correcting the phase of the correcting current supplied to said correcting magnetic field coil;

wherein the correcting magnetic field coil means and the magnetic field sensor are disposed so as to be magnetically uncoupled.

16. A magnetic resonance imaging apparatus as defined in claim 15 in which said phase correcting circuit is capable of changing the correction amount of the phase.

17. A magnetic resonance imaging apparatus as defined in claim 16 and further including means for desiredly presetting the correction amount of the phase which is obtained by said phase correcting circuit.

18. A magnetic resonance imaging apparatus as defined in claim 16 in which said phase correcting circuit comprises an operational amplifier, resistors and a capacitor.

19. A magnetic resonance imaging apparatus as defined in claim 15 in which the magnetic field sensor is disposed externally of the magnetic field generating means so that the magnetic field sensor is unaffected by magnetic interference from the magnetic field generating means.

20. A magnetic resonance imaging apparatus as defined in claim 15 in which the magnetic field sensor detects an alternating change of frequency in the environmental magnetic field greater than 5 Hz.

21. A magnetic resonance imaging apparatus as defined in claim 20 in which the alternating change has a frequency of about 50 Hz.

22. A magnetic resonance imaging apparatus as defined in claim 15 in which the magnetic field sensor is disposed externally of the magnetic field generating means.

* * * * *